(12) United States Patent
Brändle et al.

(10) Patent No.: US 6,702,931 B2
(45) Date of Patent: Mar. 9, 2004

(54) METHOD FOR MANUFACTURING A CATHODIC ARC COATED WORKPIECE

(75) Inventors: Hans Brändle, Sargans (CH); Erich Bergmann, Basel (CH)

(73) Assignee: Unaxis Balzers AG, Balzers (LI)

(*) Notice: Subject to any disclaimer, the term of this patent is extended or adjusted under 35 U.S.C. 154(b) by 0 days.

(21) Appl. No.: 10/463,096

(22) Filed: Jun. 17, 2003

(65) Prior Publication Data

US 2003/0209424 A1 Nov. 13, 2003

Related U.S. Application Data

(62) Division of application No. 08/927,864, filed on Sep. 11, 1997, now Pat. No. 6,602,390, which is a continuation of application No. 08/493,668, filed on Jun. 22, 1995, now abandoned.

(30) Foreign Application Priority Data

Jun. 24, 1994 (CH) .............................................. 2'024/94

(51) Int. Cl.$^7$ ........................... C23C 14/24; C23C 14/32
(52) U.S. Cl. ............................ 204/192.38; 204/298.41; 427/580
(58) Field of Search ..................... 204/298.41, 192.38, 204/192.13, 298.03, 298.12, 298.13; 118/723 VE; 427/580

(56) References Cited

U.S. PATENT DOCUMENTS

| | | | | |
|---|---|---|---|---|
| 4,929,322 A | * | 5/1990 | Sue et al. | 204/192.38 |
| 5,306,569 A | * | 4/1994 | Hiraki | 204/192.13 |

* cited by examiner

Primary Examiner—Rodney G. McDonald
(74) Attorney, Agent, or Firm—Notaro & Michalos P.C.

(57) ABSTRACT

A method of manufacturing a coated workpiece utilizes a target made of an alloy which is substantially a one phase. Coating is achieved by cathodic arc evaporation of the target in an oxygen atmosphere.

12 Claims, 1 Drawing Sheet

METHOD FOR MANUFACTURING A CATHODIC ARC COATED WORKPIECE

CROSS-REFERENCE TO RELATED APPLICATION

This application is a divisional of application Ser. No. 08/927,864 filed Sep. 11, 1997 and now U.S. Pat. No. 6,602,390, which was a continuation of application Ser. No. 08/493,668 filed Jun. 22, 1995, now abandoned, which claimed priority from Swiss application number 2'024/94-4 filed Jun. 24, 1994, which priority claim is repeated for the present application.

FIELD AND BACKGROUND OF THE INVENTION

The present invention relates:

to a process for coating out of a metal alloy target at least one workpiece with an oxide of a metal alloy;

to a process for the production of a target comprising a metal alloy, with the alloy in the target being present substantially in a single phase;

to a preferred embodiment of the process for electrically conducting targets in general;

to a coating apparatus for cathodic arc evaporation with a gas inlet, connected to an oxygen supply, into the vacuum recipient and with at least one evaporation target comprising a metal alloy;

to a preferred embodiment of the apparatus with an electrically conducting target in general;

to a process for operating a cathodic arc discharge; and to a use of said operating process.

Definition: In the following, the term "phase" is to be understood to mean the "crystallographic phase".

Oxides of metal alloys are conventionally deposited by reactive sputtering coating, electron beam evaporation, ion plating or by CVD processes as coatings. If attempts are made to deposit oxides of metal alloys with cathodic arc evaporation, numerous problems are encountered.

Attempts at controlling the movement of cathodic arc spots with the known means, such as with magnetic fields, which are successful with coating depositions of pure metal alloys or conducting nitrides are not successful for oxides of metal alloys. The reason for this failure is the known strong change of the secondary electron emission with the change of the target surface oxidation leading to a hysteresis of the state of the cathode surface.

In addition, the listed problems arising in alloy oxide coating are also characterized by the arc burning stationarily at particular target locations causing increased droplet emission which leads to stoichiometrically uncontrolled and even metallic droplet deposits.

Great interest with respect to fabrication technology exists in processes for coating workpieces with layers of insulating alloy oxides, in particular of stoichiometric ones, since these exhibit great hardnesses, which is known, for example, from EP-A-0 513 662, corresponding to U.S. Pat. No. 5,310,607 by the same applicant.

According to these references, hard material coatings ("Hartstoff" in German) are suggested which are essentially formed by single or mixed crystal oxides of an alloy, specifically by $(Al, Cr)_2O_3$.

It is known from the field of reactive cathodic sputtering technology to control the poisoning of the metal target with non-conducting reaction product layers, in particular of interest here, with electrically insulating oxide layers, through reactive gas regulation. Such an approach was found to be counterproductive in cathodic arc evaporation. Lowering the partial pressure of oxygen and the consequent process control toward a metal mode during arc discharge evaporation increases the danger of localized burning and therewith the danger of droplet emissions and the jumping of the cathodic arc spot movement over very large distances on the target surface.

During reactive cathodic arc evaporation for the production of nitride coating, working in an atmosphere of excess nitrogen is recommended. Transferring this concept to oxide coating of the type of primary interest here, namely primarily to alloy oxide coating, but also generally to arc vapor depositions with insulating layers, such as, for example, with non-conducting metal oxide layers, does not lead to success since in the event of an oxide coating of the target or coating with non-conducting layers, the arc discharge frequently fails and, because of the poisoning insulation through the known ignition, mechanism, can no longer be reliably ignited.

These problems exist already in coating of workpieces with oxides of pure metals by means of cathodic arc evaporation but are significantly more pronounced if oxides of metal alloys are to be arc evaporated. The intensifications of the problems with alloy evaporation compared to metal evaporation per se are also known from nitride coating technology. In this connection reference is made to O. Knotek, F. Löffler, H.-J. Scholl; Surf. & Coat. Techn. 45 (1991) 53.

It is known from JP 5 106 022 to evaporate a Ti—Al target by ion plating by means of a vacuum arc discharge and to deposit a TiAlN layer on a metal surface.

In "Cathodic arc evaporation in thin film technology" J. Vyskocil et al., J. Vac. Sci, Technol. A 10(4), July/August 1992, page 1740 a cathodic arc evaporation is described.

In "Effects of target microstructure on aluminum alloy sputtered thin film properties", R. S. Bailey, J. Vac. Sci. Technol. A 10(4), July/August 1992, page 1701 sputtered layers are addressed.

With respect to cathodic arc evaporation in which the cathode itself is vapor-coated, reference is made to EP-A-0 285 745, corresponding to U.S. Pat. No. 4,919,968.

From EP-A-0513 662, corresponding to U.S. Pat. No. 5,310,607 oxide coating by means of crucible evaporation is known.

In principle, the use of cathodic arc evaporation for the production, in particular, of metal oxide layers and, in particular, of layers of alloy oxides is extremely desirable, for one reason because the cathodic arc evaporation leads economically to high coating rates. In principle, also an improvement of the process stabilization of reactive arc evaporation coating processes with insulating layers would be desirable.

SUMMARY OF THE INVENTION

It is the task of the present invention under all of its aspects, to permit coating workpieces, in particular with metal oxides and in particular also with oxides of metal alloys, but also generally with insulating layers from electrically conducting targets in a stoichiometrically controlled way, and to implement this by utilizing the advantages peculiar to cathodic arc evaporation, such as, for example, their high coating rate.

For coating by means of an oxide of a metal alloy, this is attained through a procedure according to the invention.

Surprisingly, it has been found that by using single-phase targets, in contrast to multi-phase targets, the cathodic arc spots move much more regularly on the target which avoids burn-in and drastically reduces the droplet density.

Although in some cases a limited quantity of other phases in the target is not disturbing, their fraction, according to another feature of the invention, should not exceed 30% or preferably 10%.

As will be explained in the following in conjunction with the examples, it was further found that generally the cathodic arc spot behavior during reactive arc evaporation of electrically conducting targets, in particular of metal targets, and deposition of an electrically insulating reaction product in the form of a layer can be divided into two characteristic domains. Generally, it is possible to differentiate clearly between a domain with relatively low partial pressure of the reactive gas and a few cathodic arc spots, which jump over relatively large areas of the cathode or target surface, and a second domain of relatively high partial pressure of the reactive gas in which many cathodic arc spots move significantly faster and/or over smaller areas on the cathode or target surface.

It has been found that the utilization of the second domain according to the invention, practically completely prevents the formation of droplets.

According to the invention a multi-spot domain is optimally utilized, i.e. the process operating point is selected to be directly at those partial pressures of the reactive gas at which the arc discharge would fail.

Stabilization of the process operating point can be carried out through observation and control, but preferably through regulation, with observation parameters preferably used or, in the case of a regulation, measured regulating variables as well as set variables during the control (open loop), or manipulated variables set by means of regulation technology in the case of a closed loop. The present invention is further based on the task of suggesting a process for the production of targets comprising a metal alloy with the alloy being present in the target essentially in a single phase.

According to another feature of the invention, the use of the above stated process on aluminum/chromium alloys has been found to be excellent.

According to a preferred embodiment a hard coating of said alloy with at least 5 at % (atomic percent) chromium, preferably with 10 to 50 at % chromium, is deposited, the latter being excellently suitable, according to the above cited EP-A-0 513 662, viewed from the aspect of its layer properties, for example for coating metal cutting tools.

The adhesion of said metal alloy oxide layer, in particular of the $(Al, Cr)_2O_3$ layer, as used on cemented carbide or ceramic bodies, such as are applied for use of metal cutting tools, is significantly increased and becomes more reproducible. Preferably a metallic intermediate layer of a metal/chromium alloy is deposited non-reactively but also with cathodic arc evaporation on the workpiece. Here too, preferably a target is used on which the metal/chromium alloy, at least primarily, is present in a single phase.

The layer succession is generated in the same coating chamber through the sequential contacting of the cathodic arc discharge onto the generally different targets and, for the deposition of the metal alloy oxide layer, the reactive gas oxygen is introduced into the treatment atmosphere.

As has been stated, the deposition of non-conducting metal alloy oxide layers within the scope of process stabilization is facilitated significantly since the above described "multi-spot domain" is utilized.

But, according to another feature of the invention, this domain can be utilized generally for coating processes in which electrically conducting targets are cathodic arc discharge evaporated in a reactive gas atmosphere and out of a reactive product a coating is deposited, which product is electrically non-conducting or at least is a poorer conductor than the evaporated target material.

A coating apparatus for cathodic arc evaporation with a gas inlet, connected to an oxygen supply, into the vacuum chamber and with at least one evaporation target, in order to solve said task in terms of installation technology, is distinguished according to another feature of the invention.

Preferred embodiments of this apparatus or installation are specified according to the invention.

As mentioned, on said installation a second target can be provided, in particular with a metal/chromium alloy, preferably present primarily as a single phase, in order to deposit, apart from the metal alloy oxide layer, an adhesion-enhancing intermediate layer on the workpiece.

With respect to another feature of the invention, the following should be noted: because it was recognized according to the invention that generally during coating with layers that are electrically poorer conducting than the target material, a reactive arc evaporation process is advantageously stabilized in said multi-spot domain, the invention is directed toward an apparatus or installation in which generally an electrically conducting target is provided, preferably utilized control or regulating variables are specified with particular reference to the utilization of the discharge current frequency spectrum, as the measured regulating variable or—in the case of a control—as the observed variable, a variable which is significant for the characteristics of occurring cathodic arc spots and their movement.

BRIEF DESCRIPTION OF THE DRAWINGS

In the following the invention will be explained by example in conjunction with examples and figures, wherein.

DESCRIPTION OF THE PREFERRED EMBODIMENTS

1. Apparatus and Configuration Used

Figure 1:
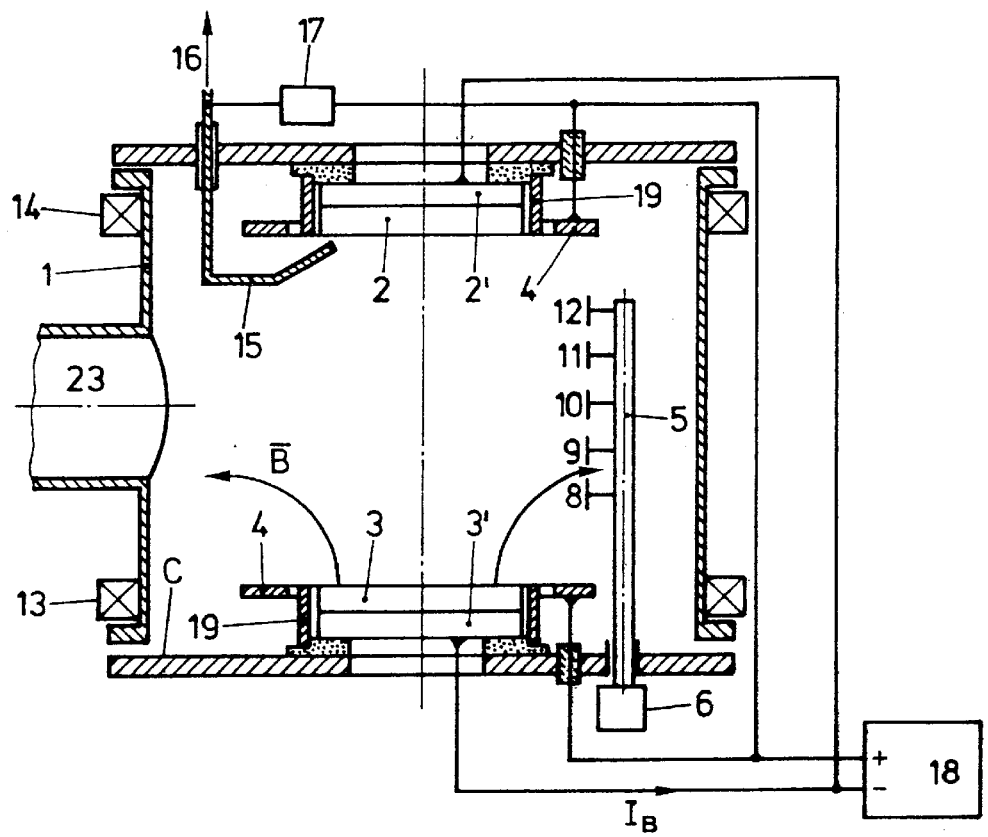
FIG. 1 is a schematic illustration of an apparatus or installation according to the invention.

In FIG. 1, a cylindrical vacuum coating chamber 1 can be evacuated through a pump opening 23. Disposed therein are cathodes 2 and 3, fastened so as to be electrically insulated from the chamber, in the form of disks on a cover and a bottom of the apparatus, by means of insulators. They are each equipped with a cooling cavity 2' and 3' in order to be able to carry off through a circulating coolant, the accumulating heat loss. Both cathodes are connected to the negative pole of a current source 18 whose positive pole is conducted to annular disks 4 (thus connected as anodes) encompassing the two cathodes, which carry off the electrons from the gas discharge.

In addition, each cathode is advantageously equipped with a so-called ignition finger 15 (only the one for the upper cathode is depicted), which can be moved by means of an actuation device 16 carried through the chamber wall under a vacuum seal, in the direction of the arrow so that the cathode can be touched with the ignition finger or it can be removed from the cathode. The current flowing as a result is limited by a resistor 17 to a few 10 A. The interruption spark generated when the ignition finger is lifted from the cathode subsequently becomes the first cathodic arc spot required for the evaporation.

The two cathodes 2 and 3 are each encompassed by a cylindrical metal sheet 19, mounted so as to be insulated from the chamber, and which prevents the migration of the cathodic arc spots onto the cylindrical side wall of the cathode and in this way restrict the movement of them to the front face of the cathodes.

Furthermore coils 13 and 14 are present—they can be connected as a Helmholtz pair—which have the effect that already at low field strengths of approximately 10 Gauss an increase of the plasma density and an increase of the mutual coating rate of the two cathodes at constant arc current occurs.

Furthermore, in the coating chamber are rotatably disposed substrate holders 5 connected to a drive 6 in order to attain uniform coating through rotational motion. On the substrate holders 5 are fastened the individual holders 8 to 12.

2. Effects of Target Implementation

Through hot-forging, a target A having a diameter of 240 mm and a thickness of 20 mm is produced from a powder mixture. The powder is composed of elementary Al and elementary Cr in a ratio of 55 percent by weight Al to 45 percent by weight Cr. After mechanical after treatment, the target surface was found to be permeated regularly with small breakouts on the order of magnitude of a few tenths mm. A small segment of the target material produced in this way was separated. Its phase composition was determined by X-ray diffraction analysis. The spectrum corresponds to a superposition of the spectrum of the cubic face-centered phase of aluminum and the cubic body-centered phase of chromium.

Target B, having the same dimensions as target A, was also produced by hot forging, but this time from the powder of an alloy. The alloy is composed of 55 percent by weight Al and 45 percent by weight Cr and had previously been produced by vacuum melting and ground in a protective gas atmosphere to a grain size of a few tenths mm. Subsequently, this powder was isostatically hot-pressed. A small segment of the target material produced in this way was separated. Its phase composition was determined by X-ray diffraction analysis. The spectrum corresponds to a mixture of γ-phases characteristic for Al—Cr alloys (see M. Hansen: Constitution of Binary Alloys, McGraw Hill 1958).

In an apparatus according to FIG. 1, however with only a single cathode, targets A and B were installed successively. A copper ring serves as anode 4 with slightly greater dimensions than the cathode and is disposed concentrically with respect to it. The following discharge conditions were chosen:

| Arc current: | 400 A |
|---|---|
| Total pressure: | $2 \cdot 10^{-3}$ mbar argon. |

With the aid of the magnetic coils 13 a magnetic field was generated over the target-surface, which extends essentially radially outward, as depicted in FIG. 1 at vector B.

The following was observed:

At target A, thus the two-phase target, the cathodic arc spots burned locally at intervals of a few seconds for approximately 1 second each, sometimes even significantly longer, at one site of the target surface. If the dwelling time of a cathodic arc spot lasted longer than approximately 5 seconds, the process was terminated manually in order to avoid strong local overheating of the target. By means of a reflex camera the movement of the cathodic arc spots as a function of the shutter speed of the camera was recorded. At dwelling times of 1/15 seconds and longer, five cathodic arc spots on average were observed. The mean speed of those cathodic arc spots which do not dwell at one site, was only approximately 1 m/s.

After an operating time of approximately one hour, the bottom of the installation in region C according to FIG. 1 was strewn with solidified particles consisting of target material. The maximum size of these ejected particles was approximately 2 mm. In addition, target A had a very porous surface. Subsequent scanning electron microscopy analysis still demonstrated a two-phase surface.

At target B, burning of the cathodic arc spots for maximally a few tenths seconds was rare, i.e. at most once every 5 minutes. The spot movement was also significantly more uniform than was the case with target A and also significantly faster. The speed of the cathodic arc spots could not be determined at the available camera shutter speeds of maximally 1/60 seconds. The speed is presumably in the range of 10 to 100 m/s. After an operating time of approximately one hour, no irregular surface structure could be observed on target B, and in region C of the installation no droplets could be seen.

Conclusion:

Even without control of the arc evaporation process in a reactive gas atmosphere, it was found for evaporation of metal alloys that a single-phase target yields significantly better cathodic arc spot behavior than is the case with evaporation of a two-phase or a multi-phase target.

Consequently, in the following the investigations were carried out with single-phase alloy targets.

3. Effect of Process Control

The apparatus or installation according to FIG. 1, however with only one cathode, was equipped with a target according to B having a diameter of 250 mm. The following operating conditions were set:

| Arc current: | 150 A |
|---|---|
| Argon pressure: | $0.18 \cdot 10^{-3}$ mbar |
| Magnetic field according to B of FIG. 1: | approximately 40 Gauss |

Dependence on Oxygen Flow

Figure 2:
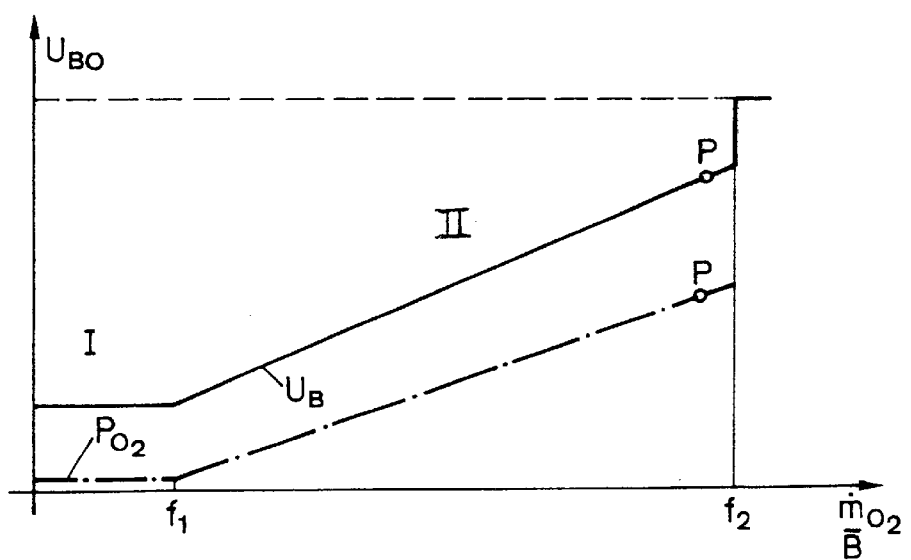
FIG. 2 is a graph qualitatively plotting the arc voltage $U_B$ and the partial pressure of oxygen $P_{O2}$ as a function of the mass flow of oxygen $m°_{O2}$ or the axial magnetic field B.

In FIG. 2 the function of the arc voltage $U_B$ as a function of the oxygen mass flow $m°_{O2}$ introduced into the installation according to FIG. 1 per unit time is shown qualitatively as is the dependence of the partial pressure of oxygen $P_{O2}$, the latter in a dash-dot line. Up to a critical flow $f_1$ the arc voltage $U_B$ remains constant. Under the conditions selected, it was 38 V. With a further increase of flow $m°_{O2}$ ($dm_{O2}/dt$) the arc voltage $U_B$ increases continuously. At a second critical flow $f_2$ the discharge is extinguished, and the no-load voltage of the generator obtains, corresponding to $U_{BO}$. This voltage is 60 V in the present case.

Since the total pressure is essentially the sum of the unchanged argon pressure and the partial pressure of oxygen $P_{O2}$, the latter remains constant up to the critical flow $f_1$, consequently also the partial pressure of oxygen $P_{O2}$ stays constant. The partial pressure of oxygen $P_{O2}$ is vanishingly small. Above the critical flow $f_1$ the partial pressure of oxygen also increases continuously and, in the present case, was $0.6 \cdot 10^{-3}$ mbar at the critical flow $f_2$.

Observation of the arc discharge yielded a significant difference in the region I below the critical flow $f_1$, and II, above said critical flow $f_1$: up to $f_1$ the discharge is characterized by few, i.e. two to five, rarely and relatively slowly jumping cathodic arc spots on the target surface. This behavior is typical for metal or nitride targets. In region II the discharge changes over into a fine network, becoming increasingly finer, of large numbers, becoming increasingly larger, of approximately 40 to 100 cathodic arc spots which move much more rapidly on the target surface.

Through the operation of the reactive arc discharge evaporation process in region II, and in particular in closest possible proximity to the critical point corresponding to $f_2$, homogeneous droplet-free aluminum/chromium oxide coating is attained. But the operation of the process corresponding to point P of FIG. 2 in closest possible proximity to the critical point $f_2$ necessitates a regulated operating point stabilization. If the requirements with respect to proximity of P to the critical value $f_2$ are relaxed, in some cases a control of the process operating point P can suffice.

Dependence on Magnetic Field

With the same configuration the effect of the magnetic field B was investigated. This is basically an axial magnetic field whose magnetic flux lines are perpendicular to the target surface. The arc voltage $U_B$ increases with increasing magnetic field B so that in FIG. 2, instead of the mass flow of oxygen $m^o{}_{O2}$ on the X-axis with respect to the arc voltage $U_B$, the strength of the magnetic field B can also be plotted.

Again, the qualitative characteristic, shown in FIG. 2, with respect to arc voltage at now constant mass flow of oxygen $m^o{}_2$ results.

Therefrom the following possibilities can be derived for the process operating point control or regulation:

a) The partial pressure of oxygen $P_{O2}$ is determined as an observed variable or, in a regulating loop, as a measured regulating variable and at least one of the following parameters is set within the scope of controlling or regulating:
  mass flow $m^o{}_{O2}$ of the oxygen,
  arc voltage $U_B$
  field strength B.

b) The arc voltage $U_B$ is observed or recorded as a measured regulating variable and at least one of the following parameters is set within the scope of controlling or regulating:
  mass flow $m^o{}_{O2}$,
  field strength of field B.

c) The frequency spectrum $S\omega$ of the arc current $I_B$ according to FIG. 1 is analyzed, for example the amplitude of a current spectral line at given frequency. Because the cathodic arc spot movement and, in particular, its frequency and speed of jumping, is reflected in the frequency spectrum of the discharge current, monitoring, for example, the amplitude of a frequency spectrum line in said current spectrum reveals the frequency with which the cathodic arc spots jump with the frequency corresponding to said spectral line. In order to set the cathodic arc spot behavior so that cathodic arc spots jump with said frequency corresponding to the monitored frequency, in turn, at least one of the following parameters is set:
  arc voltage,
  oxygen flow,
  magnetic field strength.

As described, optimum process conditions are attained if the process operating point P according to FIG. 2 is set to be in the closest possible proximity to the break corresponding to the critical oxygen flow $f_2$.

While specific embodiments of the invention have been shown and described in detail to illustrate the application of the principles of the invention, it will be understood that the invention may be embodied otherwise without departing from such principles.

What is claimed is:

1. A method for manufacturing a workpiece coated with an oxide of a metal alloy, comprising evaporating a target using cathodic arc vaporization in an atmosphere containing oxygen, and providing the target to be of an alloy material which is essentially in a single phase so as to reduce occurrence of droplets during reactive cathodic arc evaporation of the metal alloy material in the oxygen containing atmosphere.

2. A method as stated in claim 1, wherein the cathodic arc evaporating step uses an arc discharge which is operated in at least one of: a domain of a partial pressure of oxygen; a domain where a field strength of a magnetic field generated with a significant component in the direction of the arc discharge; and in which at least ten cathodic arc spots are present on the target.

3. A method as stated in claim 2, wherein the arc discharge is operated in at least one of the domains so that at least nearly a maximum number of cathodic arc spots is present on the target.

4. A method as stated in claim 1, wherein
  a) the partial pressure of oxygen during the coating process is observed and deviation from a nominal partial pressure is minimized by setting at least one of the following parameters: mass flow of oxygen, arc voltage, and field strength of a magnetic field substantially perpendicular to the target surface; or
  b) the arc voltage is observed and deviation from a nominal conducting arc voltage is minimized by setting at least one of the following parameters: mass flow of oxygen, and said magnetic field; or
  c) a frequency spectrum of the discharge current is observed and deviation of characteristic components of the spectrum from nominal characteristics is minimized by setting at least one of the following parameters: arc voltage, mass flow of oxygen, and said magnetic field; and
  observing said variable and establishing said nominal value and forming said deviation and minimizing said deviation by said setting taking place automatically by means of a process operating point closed loop.

5. A method as stated in claim 1, wherein the alloy is present at least as 70 at % in the one phase.

6. A method according to claim 1, wherein the target is cast.

7. A method according to claim 1, wherein the target is formed thermomechanically from a pulverized intermetallic alloy compound.

8. A method as stated in claim 1, wherein the alloy is an aluminum/chromium alloy.

9. A method as stated in claim 1, wherein the alloy comprises at least 5 at % chromium.

10. A method as stated in claim 1, wherein the alloy comprises at least 10 at % to 50 at % chromium.

11. A method as stated in claim 1, wherein an oxide of an aluminum/chromium alloy is deposited and that for increasing the adhesion of the deposited layer, a metallic intermediate layer is provided as an adhesion layer.

12. A method as stated in claim 1, wherein the workpiece is coated with a layer which is a poorer electrical conductor than the evaporated target material which is electrically conductive.

* * * * *